(12) United States Patent
Kicin et al.

(10) Patent No.: US 12,494,417 B2
(45) Date of Patent: Dec. 9, 2025

(54) POWER MODULE DEVICE WITH AN EMBEDDED POWER SEMICONDUCTOR DEVICE

(71) Applicant: Hitachi Energy Ltd, Zürich (CH)

(72) Inventors: Slavo Kicin, Zürich (CH); Chunlei Liu, Oberrohrdorf (CH); Andrey Petrov, Zürich (CH); Gernot Riedel, Baden-Rütihof (CH)

(73) Assignee: Hitachi Energy Ltd, Zurich (CH)

( * ) Notice: Subject to any disclaimer, the term of this patent is extended or adjusted under 35 U.S.C. 154(b) by 541 days.

(21) Appl. No.: 17/913,662

(22) PCT Filed: Feb. 25, 2021

(86) PCT No.: PCT/EP2021/054736
§ 371 (c)(1),
(2) Date: Sep. 22, 2022

(87) PCT Pub. No.: WO2021/197719
PCT Pub. Date: Oct. 7, 2021

(65) Prior Publication Data
US 2023/0112582 A1    Apr. 13, 2023

(30) Foreign Application Priority Data

Mar. 31, 2020   (EP) ..................................... 20167310

(51) Int. Cl.
*H01L 23/495*    (2006.01)
*H01L 21/50*    (2006.01)
*H01L 23/373*    (2006.01)

(52) U.S. Cl.
CPC ........ *H01L 23/49568* (2013.01); *H01L 21/50* (2013.01); *H01L 23/3735* (2013.01); *H01L 23/49562* (2013.01)

(58) Field of Classification Search
CPC ............... H01L 23/49568; H01L 21/50; H01L 23/3735; H01L 23/49562; H01L 24/05;
(Continued)

(56) References Cited

U.S. PATENT DOCUMENTS

2015/0223320 A1* 8/2015 Gerhauber ............ H01L 21/486
29/832

FOREIGN PATENT DOCUMENTS

JP    H04144259 A    5/1992
JP    2010192591 A    9/2010

OTHER PUBLICATIONS

Hou, F., et al., "High Power-Density 3D Integrated Power Supply Module Based on Panel-Level PCB Embedded Technology", 2018 IEEE 68th Electronic Components and Technology Conference, May 29-Jun. 1, 2018, 6 pages.
Hou, F., et al., "Review of Packaging Schemes for Power Module", IEEE Journal of Emerging and Selected Topics in Power Electronics, vol. 8, No. 1, Mar. 2020, pp. 223-238.
Jorgensen, A., et al., "A Fast-Switching Integrated Full-Bridge Power Module Based on GaN eHEMT Devices", IEEE Transactions on Power Electronics, vol. 34, No. 3, Mar. 2019, pp. 2494-2504.
(Continued)

*Primary Examiner* — Patricia D Valenzuela
(74) *Attorney, Agent, or Firm* — Slater Matsil, LLP

(57) ABSTRACT

In one embodiment, a power module device includes a base plate, an electrically insulating ceramic layer on the base plate, and an electrically insulating first insulating layer on the ceramic layer. The first insulating layer includes a prepreg material. An electrically conductive lead frame is disposed on the first insulating layer and electrically insulated therefrom. A power semiconductor device disposed on the lead frame and embedded between the lead frame and a second insulating layer.

20 Claims, 7 Drawing Sheets

(58) Field of Classification Search
CPC ......... H01L 24/08; H01L 24/29; H01L 24/32; H01L 2224/04026; H01L 24/19; H01L 24/20; H01L 23/13; H01L 24/80; H01L 24/83; H01L 2224/04105; H01L 2224/08245; H01L 2224/291; H01L 2224/2919; H01L 2224/32013; H01L 2224/32245; H01L 2224/73251; H01L 2224/73267; H01L 2224/80904; H01L 2224/9222; H01L 2224/92244; H01L 2924/15153; H01L 23/492; H01L 23/5389; H01L 2224/18; H01L 2224/8384; H05K 1/185

See application file for complete search history.

(56) References Cited

OTHER PUBLICATIONS

Kearney, D., et al., "PCB Embedded Semiconductors for Low-Voltage Power Electronic Applications", IEEE Transactions on Components, Packaging and Manufacturing Technology, vol. 7, No. 3, Mar. 2017, pp. 387-395.

Munding, A., et al., "Laminate Chip Embedding Technology—Impact of Material Choice and Processing for Very Thin Die Packaging", 2017 IEEE 67th Electronic Components and Technology Conference, May 30-Jun. 2, 2017, pp. 711-718.

Schnur, J., et al., "Design and Fabrication of PCB Embedded Power Module with Integrated Heat Exchanger for Dielectric Coolant", 10th International Conference on Integrated Power Electronics Systems, Mar. 20-22, 2018, 2 pages.

\* cited by examiner

POWER MODULE DEVICE WITH AN EMBEDDED POWER SEMICONDUCTOR DEVICE

CROSS-REFERENCE TO RELATED APPLICATIONS

This application is a national stage application of International Application No. PCT/EP2021/054736, filed on Feb. 25, 2021, which claims priority to European Patent Application No. 20167310.0, filed on Mar. 31, 2020, which applications are hereby incorporated herein by reference.

TECHNICAL FIELD

The invention relates to the field of power electronics and, in particular embodiments, to a power module device with an embedded power semiconductor device.

BACKGROUND

In a conventional power module a power semiconductor chip such as an insulated gate bipolar transistor (IGBT) chip, a power metal-oxide-semiconductor field effect transistor (MOSFET) chip or a power diode chip is soldered on a direct bonded copper (DBC) substrate to insure a good thermal contact and thermal spreading. DBC substrates comprising a ceramic core layer and copper (Cu) layers on both sides of the ceramic core layer are known for their excellent thermal and electrical conductivity and good mechanical properties. For manufacturing the DBC substrate direct bonding of copper foil to a ceramic core layer is performed at high temperatures usually above 1000° C. To avoid bending of the DBC substrate during manufacture copper foils having the same thickness are bonded on both sides of the ceramic core layer. Accordingly, the DBC substrate has a symmetric Cu/ceramic/Cu structure. The semiconductor chip soldered on the DBC substrate is commonly contacted by wire bonding and silicone gel is typically used to provide electric insulation and mechanical and environmental protection. The ceramic core layer of commercially available DBC substrates has a layer thickness of at least 250 µm resulting in restrictions regarding the thermal resistance of the DBC substrate.

Wide-bandgap (WBG) semiconductor based power semiconductor devices, such as silicon carbide (SiC) or gallium nitride (GaN) based power semiconductor devices, have a fast switching capability, which allows to decrease switching losses in power electronics (PE) applications. Lower switching losses in the power semiconductor device enable, for example, a higher switching frequency, which can be beneficial with regard to many aspects of system design, such as a higher power density and/or decrease of requirements on cooling. However, the switching losses depend not only on the technology of the power semiconductor device as such, but also on the parasitics such as a parasitic inductance in a commutation circuit or a gate (control) circuit. The parasitics are strongly determined by the package. Therefore, in order to fully benefit from fast switching capability of the power semiconductor device, a lot of attention has to be paid to the design of the power module, in which the power semiconductor device is integrated, to achieve for example low-inductance of commutation path and gate, balanced dynamics and current sharing, all of which finally result in fast switching without critical oscillations.

One of the most attractive technologies allowing to build a fast switching power module is printed circuit board (PCB) embedding of power semiconductor devices. PCB embedding allows for flexible module layout—module package properties can be addressed for each power semiconductor device individually. Additionally, PCB embedding simplifies integration of other components (gate drives, resistors, capacitors, temperature sensors etc.) together with the power semiconductor devices directly in the module and very close to the power semiconductor devices. Another benefit is the possibility of embedding within a housing having the same footprint or form factor as the housing of conventional power modules, enabling direct replacement of conventional power modules also in already existing PE designs.

US 2015/0223320 A1 discloses a PCB embedded power module, in which a power semiconductor device is either embedded in a laminating layer of prepreg material (e.g., FR-4) sandwiched between two rigid core layers of PCB material (e.g., FR-4), or is embedded at least partially in a cavity in one of two rigid layers of PCB material connected with each other by a laminating layer of prepreg material. A relatively large thickness of the core layers of PCB material is required to electrically insulate power semiconductor devices handling higher voltages. Such core layers of PCB material having a relatively large thickness in this known PCB embedded power module has the disadvantage of a relatively high thermal resistance and relatively poor thermal performance.

In "PCB Embedded Semiconductors for Low-Voltage Power Electronic Applications" by Daniel J. Kearney et al., IEEE TRANSACTIONS ON COMPONENTS, PACKAGING AND MANUFACTURING TECHNOLOGY, VOL. 7, NO. 3, March 2017, pp. 387-395, it is described a PCB power module device containing a three-phase invertor based on six IGBTs and six diodes as an alternative to the conventional direct bonded copper (DBC) package, in which the power semiconductor chips (IGBTs and diodes) are directly bonded onto the DBC substrate. In this PCB power module the chips of the six IGBTs and the six diodes are sintered to a copper lead frame with pre-machined cavities. The lead frame provides a mechanical support, enhances thermal spreading and distributes electrical potential to bottom electrodes of the chips. The lead frame with the chips is sandwiched between two insulating layers. For accessing and contacting the chip top-side metallization from the top, holes are drilled through the top insulating layer by laser drilling and filled with copper to form copper vias. The lead-frame with embedded semiconductors is attached to a copper baseplate through the lower insulating layer to finalize the PCB power module structure. The replacement of the traditional DBC substrate with the lead frame connected to a copper base plate by a prepreg layer is described to be advantageous with regard to improved heat spreading resulting in a lower maximum device temperature. However, the prepreg layer necessary for electrical device insolation and integration into the laminating process has the disadvantage of having a relatively high thermal resistance and, therefore, still relatively poor thermal performance.

In "Design and Fabrication of PCB Embedded Power Module with Integrated Heat Exchanger for Dielectric" by Johann Schnur et al., CIPS 2018, 10th International Conference on Integrated Power Electronics Systems, it is described an alternative approach to further improve the thermal performance by using a dielectric coolant. The described power module comprising an IGBT chip embedded in PCB material does not require any electrical insulation to the cooler and a thermal path from the IGBT chip to the cooler can be shortened. However, the electrical connection to the bottom electrode of the IGBT chip through the dielectric coolant may be more complex and less reliable than other known designs.

From the non patent literature XP055733285 it is known discloses a high power-density converter module, which comprises a bottom PCB with integrated low profile low temperature cofired ceramic (LTCC) inductor, and a top PCB, in which a low-side MOSFET and a high-side MOSFET of a buck converter circuit are integrated. The LTCC inductor comprises a bottom metallization.

From the non-patent literature XP011769568 it is known a PCB-embedded chip structure comprising a first insulating layer, a lead frame, a power die, and a second insulating layer.

From the non-patent literature XP011708538 it is known a PCB embedded die technology in which a semiconductor device is embedded in an FR-4 laminate.

SUMMARY

Embodiments of the invention provide a reliable power module device with an embedded power semiconductor device with improved thermal performance and a method for manufacturing the same.

In one embodiment, a power module device includes a base plate, an electrically insulating ceramic layer on the base plate, and an electrically insulating first insulating layer on the ceramic layer. The first insulating layer includes a prepreg material. An electrically conductive lead frame is disposed on the first insulating layer and electrically insulated therefrom. A power semiconductor device disposed on the lead frame and embedded between the lead frame and a second insulating layer.

BRIEF DESCRIPTION OF THE DRAWINGS

The subject matter of the invention will become apparent for the skilled person from the following detailed description of embodiments with reference to the attached drawings, in which.

Figure 1A:
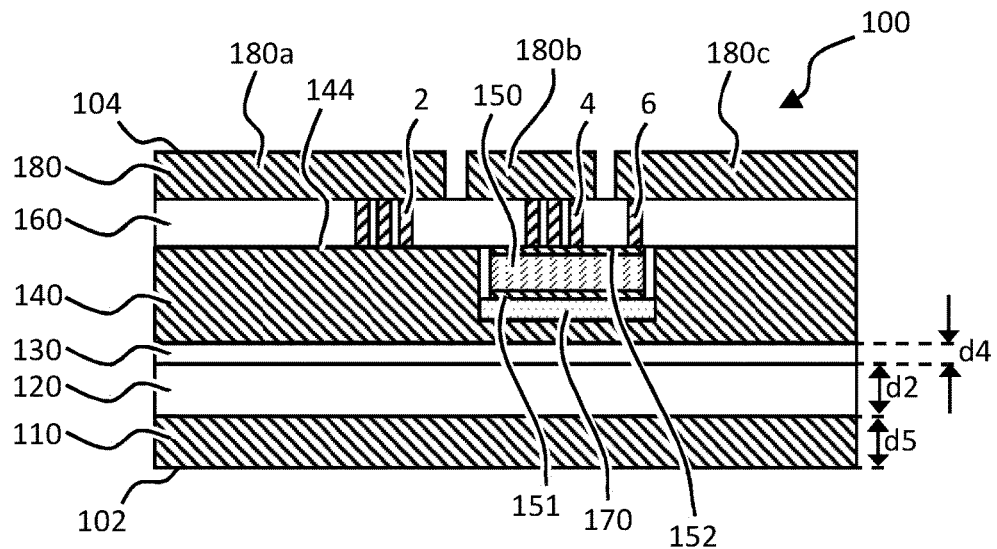
FIG. 1A shows a cross-section of a power module device according to a first embodiment.

The reference symbols used in the figures and their meanings are summarized in the list of reference symbols. Generally, alike or alike-functioning pails are given the same reference symbols. The described embodiments are meant as examples and shall not limit the scope of the invention as defined by the appended claims.

DETAILED DESCRIPTION OF ILLUSTRATIVE EMBODIMENTS

Embodiments of the invention will first be described with reference to the drawings in general. A description of each drawing will then be provided.

In an exemplary embodiment, a power module device 100, 200, 300, 400, 500, 600 has a first main side 102 and a second main side 104 opposite to the first main side 102. The power module device comprises in an order from the first main side to the second main side a base plate 110, an electrically insulating ceramic layer 120 on the base plate 110, an electrically insulating first insulating layer 130 on the ceramic layer 120, an electrically conductive lead frame 140 on the first insulating layer 130, a power semiconductor device 150 on the lead frame 140, and an electrically insulating second insulating layer 160, 160', 160" on the power semiconductor device 150 so that the power semiconductor device 150 is embedded between the lead frame 140 and the second insulating layer 160, 160', 160".

The lead frame 140 is electrically insulated from the base plate 110 by the first insulating layer 130 and the ceramic layer 120. The first insulating layer 130 comprises a prepreg material ensures a good mechanical and stable connection of the ceramic layer 120 to the lead frame 140. On the other hand, it can also be relatively thin in view of the ceramic layer 120, which provides for electrical insulation to the base plate 110. Due to the high thermal conductivity of the ceramic material that is higher than that of the prepreg material, thermal performance of the power module device is improved, while the first insulating layer 130 between the ceramic layer 120 and the lead frame 140 may be relatively thin and provides for a reliable connection between the lead frame 140 and the ceramic layer 120.

A layer thickness of the first insulating layer 130 is less than 100 μm. Such thickness of the first insulating layer 130 is significantly lower than what is usually required for electrical insulation of the lead frame 140 to the base plate 110 in a comparative example where the base plate 110 is separated from the lead frame 140 only by an insulating layer made of prepreg material.

In an exemplary embodiment, the first insulating layer 130 is in direct contact with the lead frame 140. Adhesion between the lead frame 140 and the first insulating layer 130 comprising prepreg material is relatively high and connection between lead frame 140 and first insulating layer 130 can withstand thermal cycling during device operation.

In an exemplary embodiment, the base plate 110 may comprise an electrically conductive material. For example, the base plate 110 may comprise metal such as copper. In this exemplary embodiment the base plate 110 is suitable for connection to a cooler. Metal and in particular copper has a relatively high electrical and thermal conductivity. It has good heat spreading properties and exhibits very good adhesion to the ceramic layer 120.

In an exemplary embodiment, the second insulating layer 160, 160', 160" comprises prepreg material. In case that the second insulating layer 160, 160', 160" comprises prepreg material embedding of the power semiconductor device 150 and forming the connection between the lead frame 140 and the ceramic layer 120 can be done in a single prepreg bonding process with application of pressure and heat. Accordingly, manufacturing of the power module device is facilitated.

In an exemplary embodiment, the power module device comprises an electrically conductive layer on the second insulating layer 160, 160', 160" on a side opposite to the power semiconductor device 150, wherein the power semiconductor device 150 is electrically connected to the electrically conductive layer through at least one via extending through the second insulating layer 160, 160', 160".

A layer thickness of the first insulating layer 130 may be less than 70 μm.

In an exemplary embodiment, the ceramic layer 120 comprises an electrically insulating ceramic layer 120 having a thermal conductivity above 20 W/(m×K) such as aluminum oxide ($Al_2O_3$) or aluminum nitride (AlN) or silicon nitride ($Si_3N_4$). A thermal conductivity above 20 W/(m×K) is significantly higher than that of all prepreg or PCB materials available up today.

In an exemplary embodiment, a recess 143, 142' is formed in the lead frame 140 on a side opposite to the first insulating layer 130, and at least a portion of the power semiconductor device 150 is arranged in the recess 143, 142'. The recess 143, 142' facilitates embedding of the power semiconductor device 150 in the power module device.

In an exemplary embodiment, a layer thickness of the ceramic layer 120 is 200 μm or less, or is 100 μm or less. For example, the layer thickness of the ceramic layer 120 may be in a range from 50 μm to 200 μm or in a range from 50 μm to 100 μm. With such layer thickness the ceramic layer 120 and a relatively thin first insulating layer 130 can provide sufficient electrical insulation for all voltage classes of interest.

In an exemplary embodiment, the power semiconductor device 150 is a semiconductor chip having a bottom side, wherein a metallization layer is formed on the bottom side and the metallization layer is electrically and thermally connected to the lead frame 140. In such exemplary embodiment the electrical and thermal contact to the lead frame 140 is facilitated.

In an exemplary embodiment, the power semiconductor device 150 comprises at least one of an insulated gate bipolar thyristor, a thyristor, a metal-insulator-semiconductor field effect transistor, a junction field effect transistor, a diode, and a Schottky diode.

In an exemplary embodiment, an adhesion layer 125 is arranged between the ceramic layer 120 and the first insulating layer 130, wherein the adhesion layer 125 comprises a metal layer such as a copper layer. A thickness of the adhesion layer 125 may be less than 50 μm or less than 25 μm or less than 10 μm. Therein, the first insulating layer 130 and the ceramic layer 120 may be in direct contact with the adhesion layer 125. The adhesion layer 125 provides for improved adhesion between the ceramic layer 120 and the prepreg material of the first insulating layer 130.

In another exemplary embodiment, the first insulating layer 130 is in direct contact with the ceramic layer 120.

In the following a power module device 100 according to a first embodiment is explained. FIG. 1A shows a cross-section of the power module device 100 and FIGS. 2A to 2D illustrate method steps in an exemplary embodiment of a method for manufacturing the power module device 100 of FIG. 1A. The power module device 100 has a first main side 102 and a second main side 104 opposite to the first main side 102. In an order from the first main side 102 to the second main side 104 the power module device 100 comprises a base plate 110, an electrically insulating ceramic layer 120, an electrically insulating first insulating layer 130, an electrically conductive lead frame 140, a power semiconductor device 150, an electrically insulating second insulating layer 160 and an electrically conductive layer 180.

The power semiconductor device 150 may be a semiconductor chip having a bottom side and a top side opposite to the bottom side. The bottom side is that side of the semiconductor chip which faces towards the first main side 102, and the top side is that side of the semiconductor chip which faces towards the second main side 104. A bottom metallization layer 151 is formed on the bottom side and electrically connected to the lead frame 140. Exemplarily the bottom metallization layer 151 is connected to the lead frame 140 by a contact layer 170 which may be either a sintered layer, a solder layer or glue layer (due to its function of bonding the semiconductor chip to the lead frame contact layer 170 may also be referred to as a bond layer). Alternatively, the bottom metallization layer 151 may be directly connected to the lead frame 140.

Exemplarily, the power semiconductor device 150 may comprise at least one of an insulated gate bipolar transistor (IGBT), a thyristor, a metal-insulator-semiconductor field effect transistor (MISFET), a metal-oxide-semiconductor field effect transistor (MOSFET), a junction field effect transistor (JFET), a diode, and a Schottky diode.

Figure 2A:
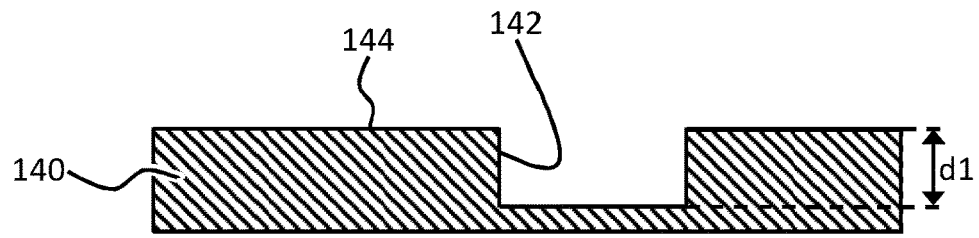
FIGS. 2A-2D illustrate method steps in an exemplary embodiment of a method for manufacturing the power module device of FIG. 1A.

In the first embodiment, a recess 142 (see FIG. 2A) is formed in the lead frame 140 on a side thereof which is facing towards the second main side 104. The lead frame 140 may have a flat upper surface 144 facing towards the second main side 104, from which upper surface 144 the recess 142 is recessed. As shown in FIG. 2A, which shows the lead frame 140 of the power module device 100 without the other elements of the power module device 100, the recess 142 has a depth d1. In the first embodiment the depth d1 is substantially the same as the combined thickness of contact layer 170, bottom metallization layer 151, power semiconductor device 150 and top metallization layer 152. Accordingly, the upper substantially flat surface 144 of the lead frame 140 is substantially flush with the upper side of the top metallization layer 152, which upper side is that side of the top metallization layer 152 which is facing towards the second main side 104.

The ceramic layer 120 is arranged on the base plate 110. The base plate 110 and the ceramic layer 120 may be in direct contact with each other. The first insulating layer 130 is arranged on the ceramic layer 120. The ceramic layer 120 and the first insulating layer 130 may be in direct contact with each other. The lead frame 140 is arranged on the first insulating layer 130. Therein, the first insulating layer 130 and the lead frame 140 may be in direct contact with each other.

The second insulating layer 160 is arranged on lead frame 140 and on the power semiconductor device 150. It may be in direct contact with at least the upper side 144 of the lead frame 140 and with the upper side of the top metallization layer 152. The power semiconductor device 150 together with the top metallization layer 152, the bottom metallization layer 151 and the contact layer 170 is sandwiched or embedded between the second insulating layer 160 and the lead frame 140. A space between lateral side walls of the recess 142 and lateral sides of the power semiconductor device 150 may be filled at least partially by the second insulating layer 160 or by another insulating material. Alternatively, this space may be filled with a gas or may be an empty space.

The base plate 110 may comprise an electrically conductive material, such as a metal. Exemplarily, the base plate 110 may be made of copper (Cu). In the before explained configuration, the lead frame 140 is electrically insulated from the base plate 110 by the ceramic layer 120 and the first insulating layer 130, which are arranged between the base plate 110 and the lead frame 140.

The ceramic layer 120 is electrically insulating. It may comprise aluminum oxide ($Al_2O_3$) or aluminum nitride (AlN) or silicon nitride ($Si_3N_4$), for example, which all have a high thermal conductivity. The thermal conductivity of a ceramic layer 120 depends not only on the chemical composition but also on the crystallinity of the ceramic layer 120. The ceramic layer 120 may have a thermal conductivity above 20 W/(m×K), whereas known prepreg materials have a thermal conductivity well below 10 W/(m×K). For example FR-4 has a thermal conductivity of about 0.4 W/(m×K). Accordingly, the ceramic layer 120 can provide significantly improved thermal performance of the power module device 100.

A layer thickness d2 of the ceramic layer 120 may be 200 μm or less, or may be 100 μm or less. For example, d2 may be in a range from 50 μm to 200 μm or in a range from 50 μm to 100 μm. With layer d2 in such ranges sufficient electrical insulation for the voltage classes of interest can be achieved.

The first insulating layer 130 comprises a prepreg material, which is a material comprising a thermally stable inorganic filler material and a thermally softening plastics or thermoset polymer matrix material. The filler material may be a fibrous material like fiber glass, cellulose fiber, cotton fiber or composite fibers. The matrix material may exemplarily be epoxy resin, phenolic resin, or polyester. Thermally softening plastics is solid under normal environmental conditions, but softens when elevated temperature and/or elevated pressure is applied, and solidifies again once the elevated temperature/pressure conditions are relieved.

The first insulating layer 130 may exemplarily comprise a prepreg material made from FR-2 (phenolic resin matrix with cotton paper filler), FR-3 (epoxy resin matrix with cotton paper filler), FR-4 (epoxy resin matrix with woven glass filler), FR-6 (polyester matrix with matte glass filler), G-10 (epoxy resin with woven glass filler), CEM-2 (epoxy resin with woven glass filler), CEM-3 (epoxy resin with non-woven glass filler), CEM-4 (epoxy resin matrix with woven glass filler), CEM-5 (polyester matrix with woven glass filler). The first insulating layer 130 comprising prepreg material has the characteristics of an adhesive.

A layer thickness d4 of the first insulating layer 130 is less than 100 μm or less than 70 μm. Due to the efficient electrical insulation through the ceramic layer 120, the first insulating layer 130 comprising prepreg material may be much thinner than if the first insulating layer 130 would be the only element electrically insulating the lead frame 140 from the base plate 110. Only a relatively thin first insulation layer 130 comprising prepreg material is sufficient for providing a reliable connection between the ceramic layer 120 and the lead frame 140. Accordingly, the thermal resistance of the first insulating layer 130 can be relatively low.

The second insulating layer 160 may also comprises prepreg material which facilitates manufacturing of the power module device 100 as explained below in more detail with reference to FIGS. 2A to 2D.

In the first embodiment, an electrically conductive layer 180 is arranged on the second insulating layer 160 on a side opposite to the power semiconductor device 150, wherein the power semiconductor device 150 is electrically connected to the electrically conductive layer 180 through at least one via 2, 4, 6 extending through the second insulating layer 160 in a vertical direction perpendicular to the upper surface 144 of the lead frame 140. As shown in FIG. 1, the electrically conductive layer 180 may include a first layer portion 180a, a second layer portion 180b and a third layer portion 180c, which are separate and electrically isolated from each other. The first layer portion 180a is connected through one or more first vias 2 to the lead frame 140, which is electrically connected to the bottom metallization 151 through the contact layer 170.

The bottom metallization 151 may be electrically connected to a first main terminal of the power semiconductor device 150. The second layer portion 180b may be electrically connected through one or more second vias 4 to a first portion of the top metallization layer 152, wherein the first portion of the top metallization layer 152 may be electrically connected to a second main terminal of the power semiconductor device 150. The first portion and the second portion of the top metallization layer 152 are separate and electrically isolated from each other (in the figures the separation between the first portion and the second portion of the top metallization layer 152 is not shown). The third layer portion 180c may be electrically connected through one or more third vias 6 to the second portion of the top metallization layer 152, which may be electrically connected to a control terminal of the power semiconductor device 150.

In an exemplary embodiment, the power semiconductor device 150 may be an electrical switch, in which a current flowing between the first main contact and the second main contact can be controlled by a current or voltage applied to the control terminal.

In the following an exemplary method for manufacturing the power module device 100 according to the first embodiment is described with reference to FIGS. 2A to 2D. Therein, elements having the same reference signs as described above with reference to FIG. 1A have the same characteristics or features and a detailed description thereof will not be repeated.

Figure 2B:
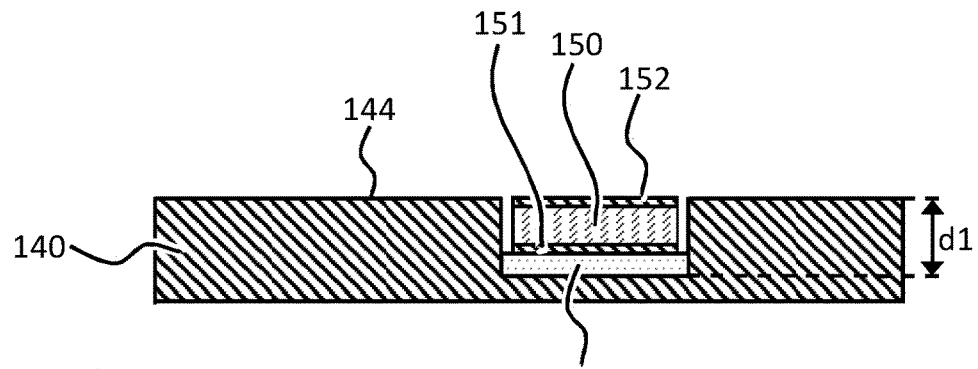
Figure 2C:
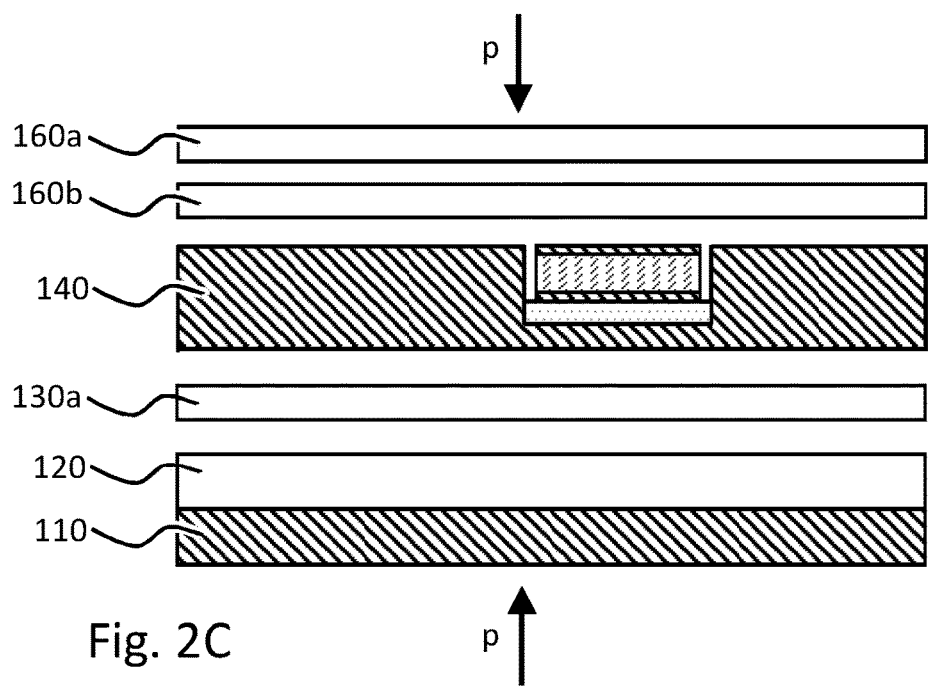

The exemplary method for manufacturing the power module device 100 according to the first embodiment comprises a method step of providing the lead frame 140 as shown in FIG. 2A and as described above. Thereafter, the power semiconductor device 150 with the bottom metallization layer 151 and the top metallization layer 152 is attached to a bottom of the recess 142 in the lead frame 140 by a contact layer 170 as shown in FIG. 2B. Attaching of the power semiconductor device 150 to the lead frame 140 can be performed by e.g. soldering, sintering or gluing. If attaching is performed by soldering, then the contact layer 170 is a solder layer, if attaching is performed by sintering, then the contact layer 170 is a sintered layer, and if attaching is performed by gluing then the contact layer 170 is a glue layer. Alternatively, the power semiconductor device 150 may be bonded directly on the lead frame 140 without the contact layer 170, i.e. with a direct contact between the bottom metallization layer 151 and the lead frame 140.

In another method step the ceramic layer 120 is formed by e.g. 3D printing, additive manufacturing, cold gas spraying, low temperature cofiring or any other suitable process for forming a thin ceramic layer. The ceramic layer 120 may be directly formed on the base plate 110 as a substrate or it may be formed separately and attached to the base 110 only afterwards. Forming the ceramic layer 120 with a layer thickness d2 of 200 μm or less is facilitated when using the base plate 110 as a substrate.

In another method step, the base plate 110, the ceramic layer 120, at least one first prepreg layer 130a, the lead frame 140 together with the power semiconductor device 150 attached to the lead frame 140, and at least one second prepreg layer 160a, 160b are arranged in a layer stack (also referred to as a layer-up process). This layer stack is then fused together by applying pressure and heat (also referred to as a prepreg bonding process). The prepreg layers 130a, 160a, 160b have the characteristics of an adhesive which may be activated by temperature and/or pressure applied to the layer stack. After the prepreg bonding process, the at least one first prepreg layer 130a is transformed into the first insulating layer 130 and the at least one second prepreg layer 160a, 160b is transformed into the second insulating layer 160.

Figure 2D:
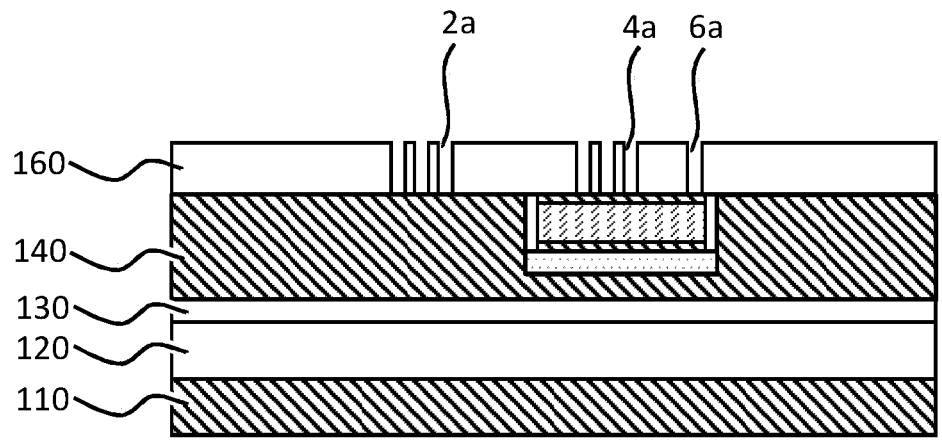
Figure 3:
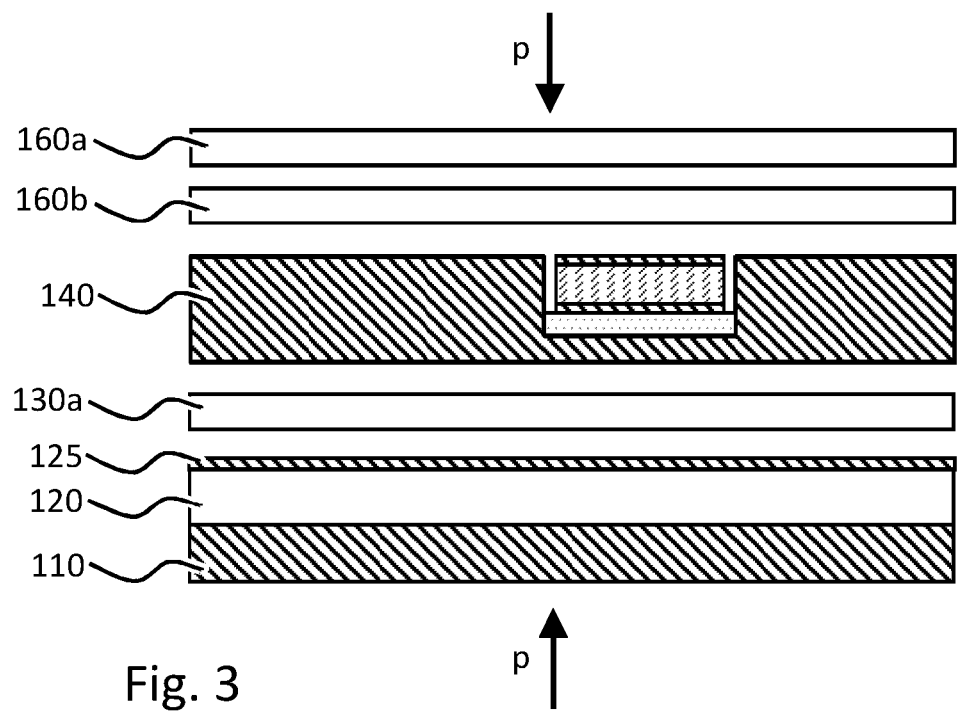
FIG. 3 illustrates method steps in an exemplary embodiment for a method for manufacturing the power module device of FIG. 1B.

Thereafter, first to third holes 2a, 4a and 6a are drilled through the second insulating layer 160 as shown in FIG. 2D. A first via 2 is formed in each first hole 2a, a second via 4 is formed in each second hole 4a, and a third via 6 is formed in each third hole 6a.

Then, the electrically conductive layer 180 is formed on the resulting structure to obtain the power module device 100 as shown in FIG. 1A.

Figure 1B:
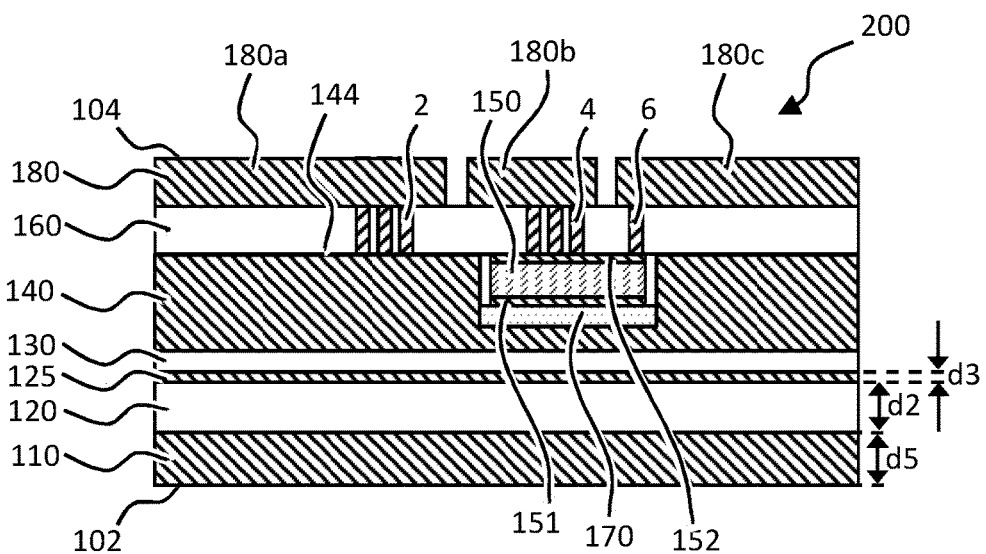
FIG. 1B shows a cross-section of a power module device according to a modification of the first embodiment.

In FIG. 1B there is shown a cross-section of a power module device 200 according to a modification of the first embodiment. Due to many similarities between the power module device 100 and the power device 200, only differences will be explained in the following, whereas with regard to all other features it is referred to the above discussion of power module device 100. The power module device 200 differs from the power module device 100 only in that an adhesion layer 125 is arranged between the ceramic layer 120 and the first insulating layer 130, wherein the adhesion layer 125 comprises a metal layer such as a copper layer. A layer thickness d3 of the adhesion layer 125 may be less than 50 μm or less than 25 μm or less than 10 μm. Exemplarily a layer thickness d5 of the base plate 110 is at least two or three times the layer thickness d3 of the adhesion layer 125.

The adhesion layer 125 may be in direct contact to the ceramic layer 120 and to the first insulating layer 130, respectively. By means of the adhesion layer 125 a strong joint between the ceramic layer 120 and the first insulating layer 130 can be attained. The joint between the ceramic layer 120 and the first insulating layer 130 is stronger and more stable and thereby more reliable than without the adhesion layer 125.

An exemplary method for manufacturing power module device 200 is similar to the exemplary method for manufacturing power module device 100 described above. The only difference is that the copper adhesive layer 125 described above is formed on the ceramic layer 120 by e.g. a sputtering process, additive manufacturing or cold spraying before the prepreg bonding process. In the layer stack formed by the layer-up process, the copper adhesive layer 125 is arranged between the ceramic layer 120 and the at least one first prepreg layer 130a to enhance connection between the ceramic layer 120 and the at least one first prepreg layer 130a.

Figure 4A:
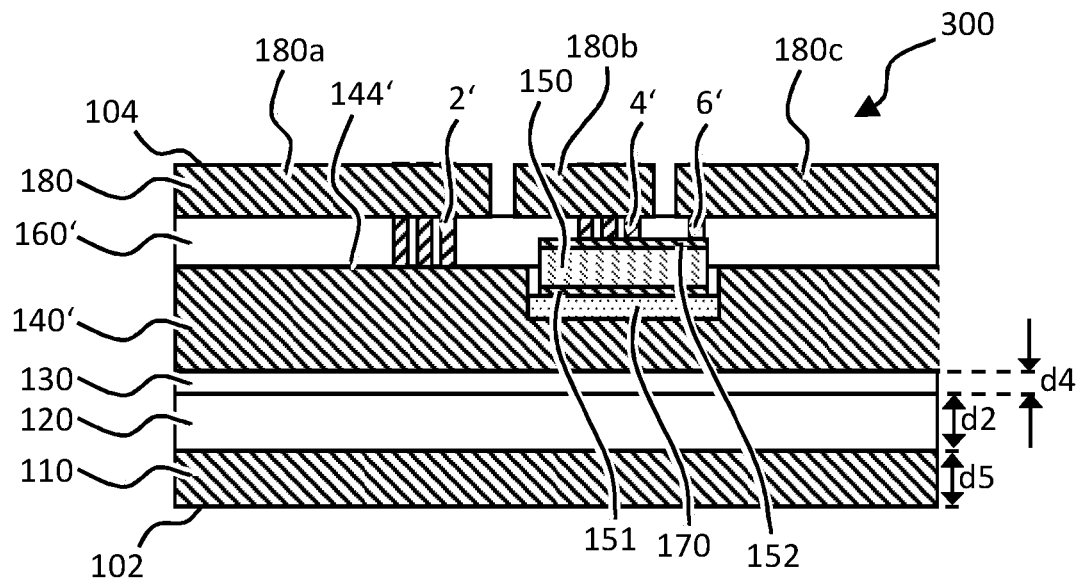
FIG. 4A shows a cross-section of a power module device according to a second embodiment.

In FIG. 4A there is shown a cross-section of a power module device 300 according to a second embodiment. Due to many similarities between the power module device 100 according to the first embodiment and the power module device 300 according to the second embodiment, only differences will be explained in the following, whereas with regard to all other features it is referred to the above discussion of power module device 100. The power module device 300 according to the second embodiment differs from the power module device 100 according to the first embodiment in that a depth d1' of a recess 142' in lead frame 140' is less than a combined thickness of contact layer 170, bottom metallization layer 151, power semiconductor device 150 and top metallization layer 152. Otherwise the lead frame 140' is the same as the lead frame 140 in the first embodiment. Accordingly, an upper substantially flat surface 144' of the lead frame 140' is not substantially flush with the upper side of the top metallization layer 152, but a portion of a stack comprising the contact layer 170, bottom metallization layer 151, power semiconductor device 150 and top metallization layer 152, protrudes from the upper substantially flat surface 144' of the lead frame 140'.

A second insulating layer 160' differs from the second insulating layer 160 in the first embodiment in that it has a smaller thickness in a portion above the recess 142' and a larger thickness in a portion above the upper substantially flat surface 144' of the lead frame 140', whereas a thickness of the second insulating layer 160 in the power module device 100 may not be different in a portion above the recess 142 and in a portion above the upper substantially flat surface 144. According to the variation of the thickness of the second insulating layer 160', a length of the vias 2', 4' and 6' may be different. The first via 2' has to extend through a relatively thick portion of the second insulating layer 160', whereas the second via 4' and the third via 6' have to extend through a relatively thin portion of the second insulating layer 160'. The power module device 300 according to the second embodiment has the advantage compared to the power module device 100 according to the first embodiment that the lead frame has less thickness variations and a thermal spreading can be improved. On the other side, the second insulating layer 160' may require a larger thickness than the second insulating layer 160 for embedding the power semiconductor device 150.

In the following an exemplary method for manufacturing the power module device 300 according to the second embodiment is described with reference to FIGS. 5A to 5C. Therein, elements having the same reference signs as described above with reference to FIGS. 1A and 4A have the same characteristics or features, and a detailed description thereof will not be repeated.

Figure 5A:
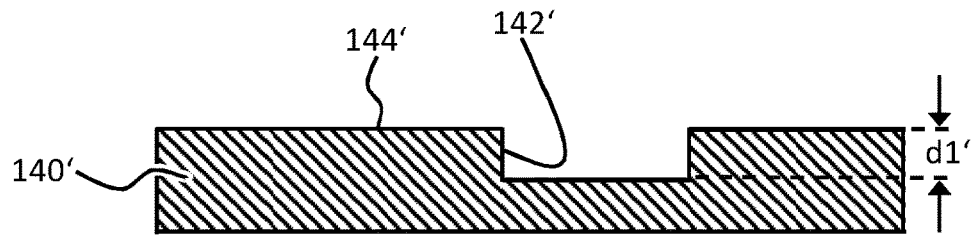
FIG. 5A-5C illustrate method steps in an exemplary embodiment of a method for manufacturing the power module device of FIG. 4A.
Figure 5B:
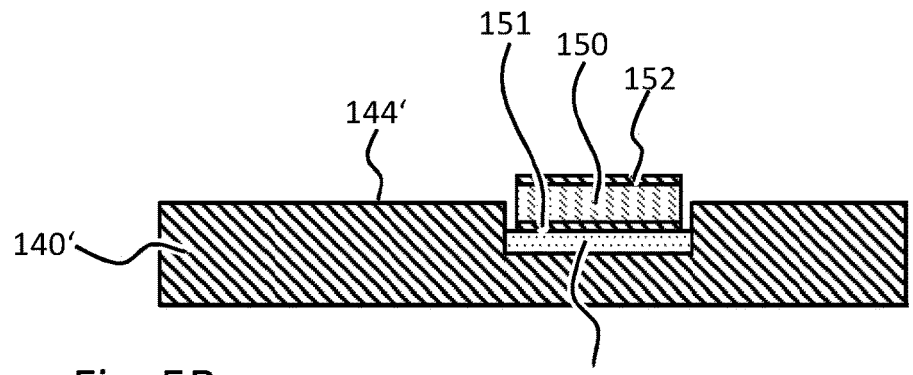

The exemplary method for manufacturing the power module device 300 according to the second embodiment comprises a method step of providing the lead frame 140' as shown in FIG. 5A and as described above. Thereafter, the power semiconductor device 150 with the bottom metallization layer 151 and the top metallization layer 152 is attached to a bottom of the recess 142' in the lead frame 140' by a contact layer 170 as shown in FIG. 5B. As in the exemplary embodiment described above with reference to FIGS. 2A to 2D, attaching of the power semiconductor device 150 to the lead frame 140' can be performed by e.g. soldering, sintering or gluing. As shown in FIG. 5B a stack comprising the contact layer 170, the bottom metallization layer 151, the power semiconductor device 150 and the top metallization layer 152, protrudes from the lead frame 140', i.e. the upper surface of the top metallization layer 152 is closer to the second main side 104 than an upper substantially flat surface 144' of the lead frame 140'.

In another method step the ceramic layer 120 is formed as in the exemplary embodiment described above with reference to FIGS. 2A to 2D, and a repeated description is omitted.

Figure 5C:
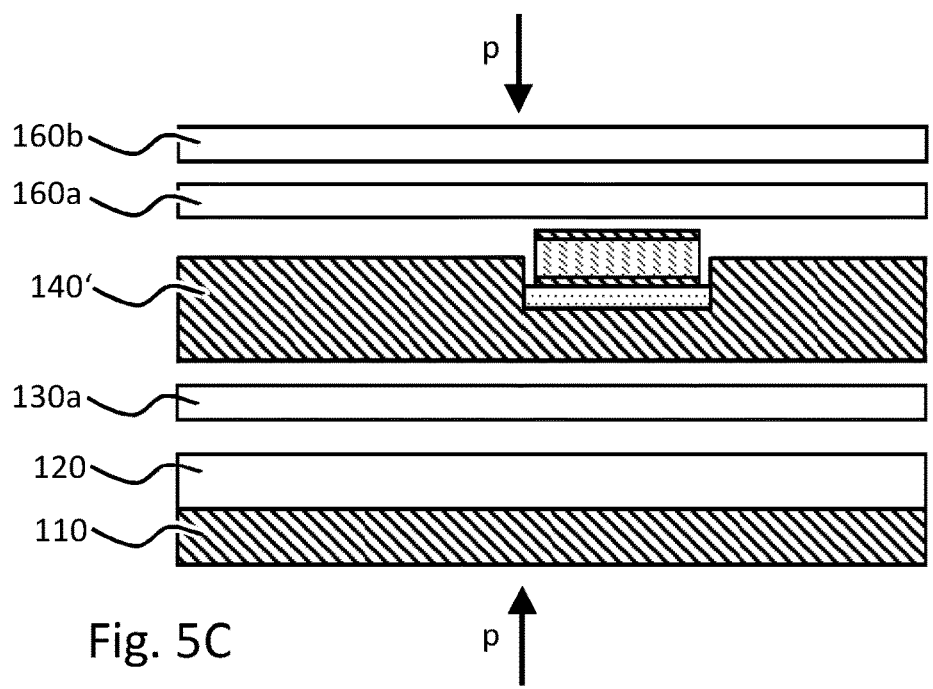

In another method step similar as in the exemplary embodiment described above with reference to FIGS. 2A to 2D, the base plate 110, the ceramic layer 120, at least one first prepreg layer 130a, the lead frame 140' together with the power semiconductor device 150 attached to the lead frame 140', and at least one second prepreg layer 160a, 160b are arranged in a layer stack (also referred to as a layer-up process) as shown in FIG. 5C. This layer stack is then fused together by applying pressure and heat (also referred to as a prepreg bonding process). The prepreg layers 130a, 160a, 160b have the characteristics of an adhesive which may be activated by temperature and/or pressure applied to the layer stack. After the prepreg bonding process, the at least one first prepreg layer 130a is transformed into the first insulating layer 130 and the at least one second prepreg layer 160a, 160b is transformed into the second insulating layer 160'.

Thereafter, first to third holes are drilled through the second insulating layer 160' similar as described above with reference to FIG. 2D. The only difference here is that holes through a portion the second insulating layer 160' located above the power semiconductor device 150 are shorter than holes drilled through a portion of the second insulating layer 160' located above the upper substantially flat surface 144' of the lead frame 140' (i.e. through a portion of the second insulating layer 160' which is not located above the power semiconductor device 150. A first via 2' is formed in each first hole, a second via 4' is formed in each second hole, and a third via 6' is formed in each third hole similar as described above.

Then, the electrically conductive layer 180 is formed on the resulting structure to obtain the power module device 300 as shown in FIG. 4A.

Figure 4B:
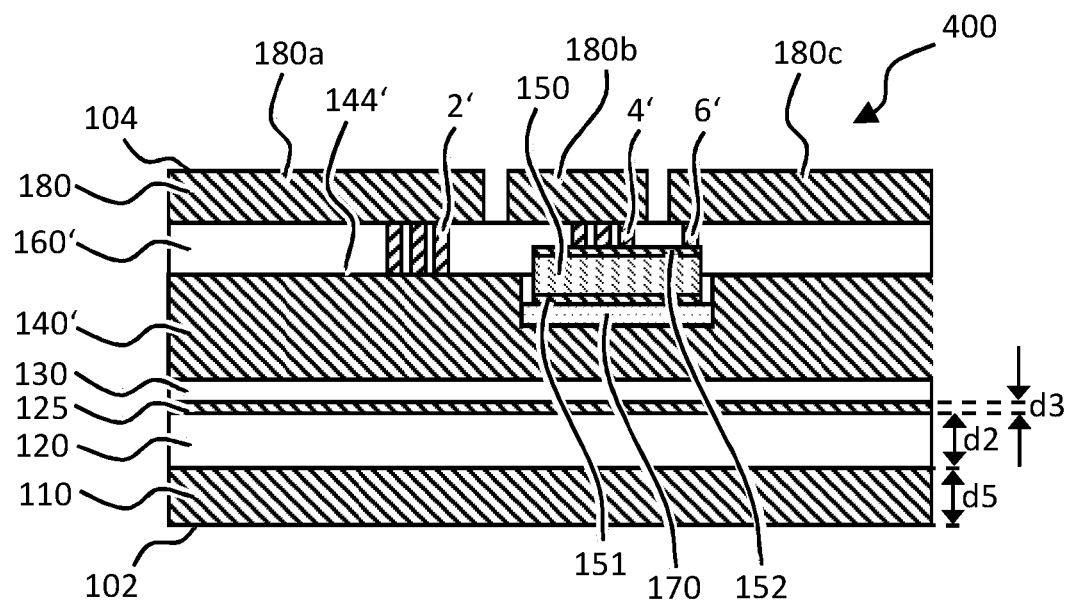
FIG. 4B shows a cross-section of a power module device according to a modification of the second embodiment.

In FIG. 4B there is shown a cross-section of a power module device 400 according to a modification of the second embodiment. Due to many similarities between the power module device 300 and the power device 400, only differences will be explained in the following, whereas with regard to all other features it is referred to the above discussion of power module device 300. The power module device 400 differs from the power module device 300 only in that an adhesion layer 125 is arranged between the ceramic layer 120 and the first insulating layer 130 as in the modified first embodiment, wherein the adhesion layer 125 comprises a metal layer such as a copper layer. As in the above described modification of the first embodiment, a layer thickness d3 of the adhesion layer 125 may be less than 50 µm or less than 25 µm or less than 10 µm. Exemplarily the layer thickness d5 of the base plate 110 is at least two or three times the layer thickness d3 of the adhesion layer 125. The adhesion layer 125 may be in direct contact to the ceramic layer 120 and to the first insulating layer 130, respectively. By means of the adhesion layer 125 a joint between the ceramic layer 120 and the first insulating layer 130 can be facilitated as in the modified first embodiment. The joint is stronger and more stable and thereby more reliable than without the adhesion layer 125.

An exemplary method for manufacturing power module device 400 is similar to the exemplary method for manufacturing power module device 300 described above. The only difference is that the copper adhesive layer 125 described above is formed on the ceramic layer 120 by e.g. a sputtering process, additive manufacturing or cold spraying before the prepreg bonding process. In the layer stack formed by the layer-up process, the copper adhesive layer 125 is arranged between the ceramic layer 120 and the at least one first prepreg layer 130a to enhance connection between the ceramic layer 120 and the at least one first prepreg layer 130a.

Figure 6A:
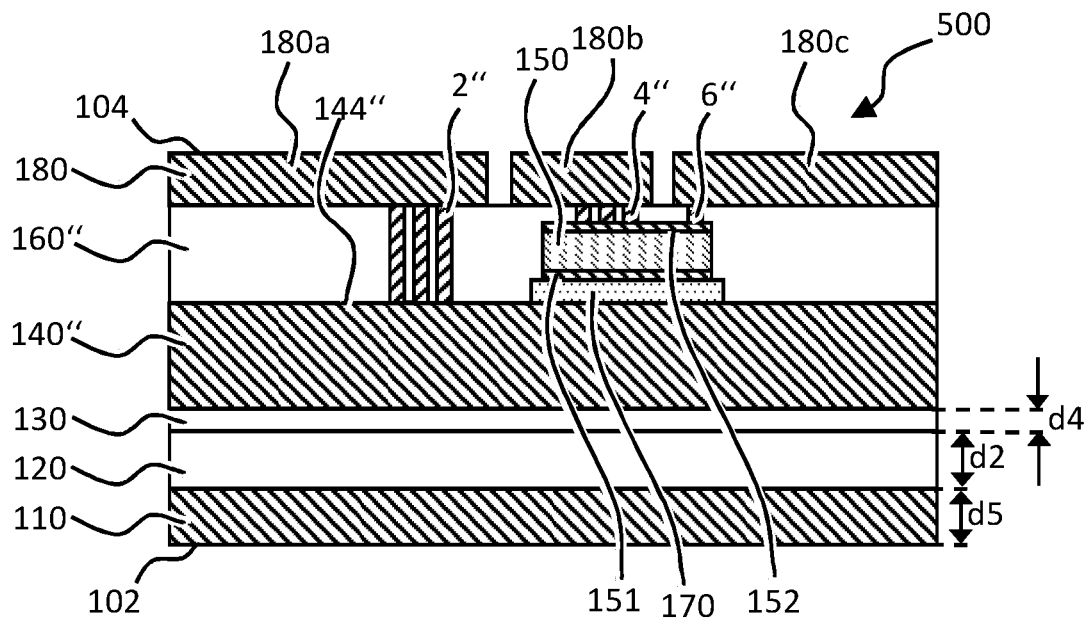
FIG. 6A shows a cross-section of a power module device according to a third embodiment.

In FIG. 6A there is shown a cross-section of a power module device 500 according to a third embodiment. Due to many similarities between the power module device 100 according to the first embodiment and the power module device 500 according to the third embodiment, only differences will be explained in the following, whereas with regard to all other features it is referred to the above discussion of power module device 100. The power module device 500 differs from the power module device 100 in that a lead frame 140" has 110 recess and the power semiconductor device 150 is arranged on a continuous upper flat surface 144" of the lead frame 140". Accordingly, the lead frame 140" may have a constant thickness, resulting in improved thermal spreading of heat in the lead frame 140" compared to the first and second embodiment. On the other side, a difference in the thickness of a first portion of the second insulating layer 160" above the power semiconductor device 150 (i.e. a portion which overlaps with the power semiconductor device 150 when viewed in a direction perpendicular to the upper substantially flat surface 144") and a second portion of the second insulating layer 160" lateral to the power semiconductor device (i.e. a portion which does not overlap with the power semiconductor device 150 when viewed in a direction perpendicular to the upper substantially flat surface 144") is larger than in the second embodiment.

In the following an exemplary method for manufacturing the power module device 500 according to the third embodiment is described with reference to FIGS. 7A to 7C. Therein, elements having the same reference signs as described above with reference to FIGS. 1A and 6A have the same characteristics or features, and a detailed description thereof will not be repeated.

Figure 7A:
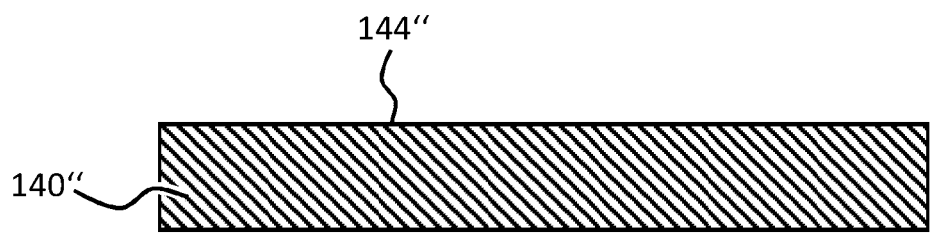
FIGS. 7A-7C illustrate method steps in an exemplary embodiment of a method for manufacturing the power module device of FIG. 6A.
Figure 7B:
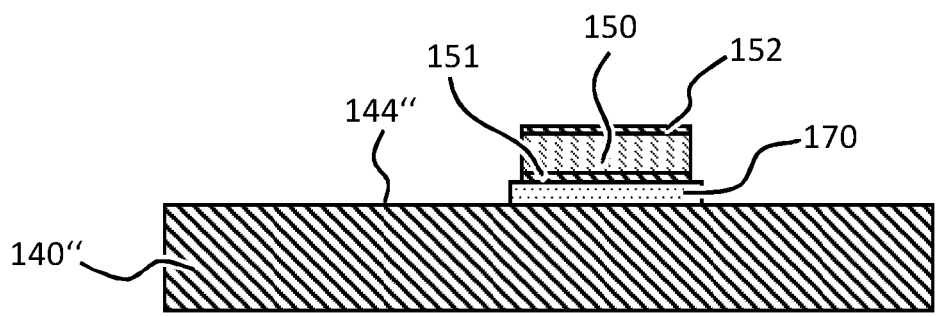

The exemplary method for manufacturing the power module device 500 according to the third embodiment comprises a method step of providing the lead frame 140" as shown in FIG. 7A and as described above. Thereafter, the power semiconductor device 150 with the bottom metallization layer 151 and the top metallization layer 152 is attached to the lead frame 140" on the upper substantially flat surface 144" of the lead frame 140" by a contact layer 170 as shown in FIG. 7B. As in the exemplary embodiment described above with reference to FIGS. 2A to 2D, attaching of the power semiconductor device 150 to the lead frame 140" can be performed by e.g. soldering, sintering or gluing. As shown in FIG. 7B the whole stack comprising the contact layer 170, the bottom metallization layer 151, the power semiconductor device 150 and the top metallization layer 152, protrudes from the lead frame 140", i.e. the whole stack is closer to the second main side 104 than the upper substantially flat surface 144" of the lead frame 140".

In another method step the ceramic layer 120 is formed as in the exemplary embodiment described above with reference to FIGS. 2A to 2D, and a repeated description is omitted.

Figure 7C:
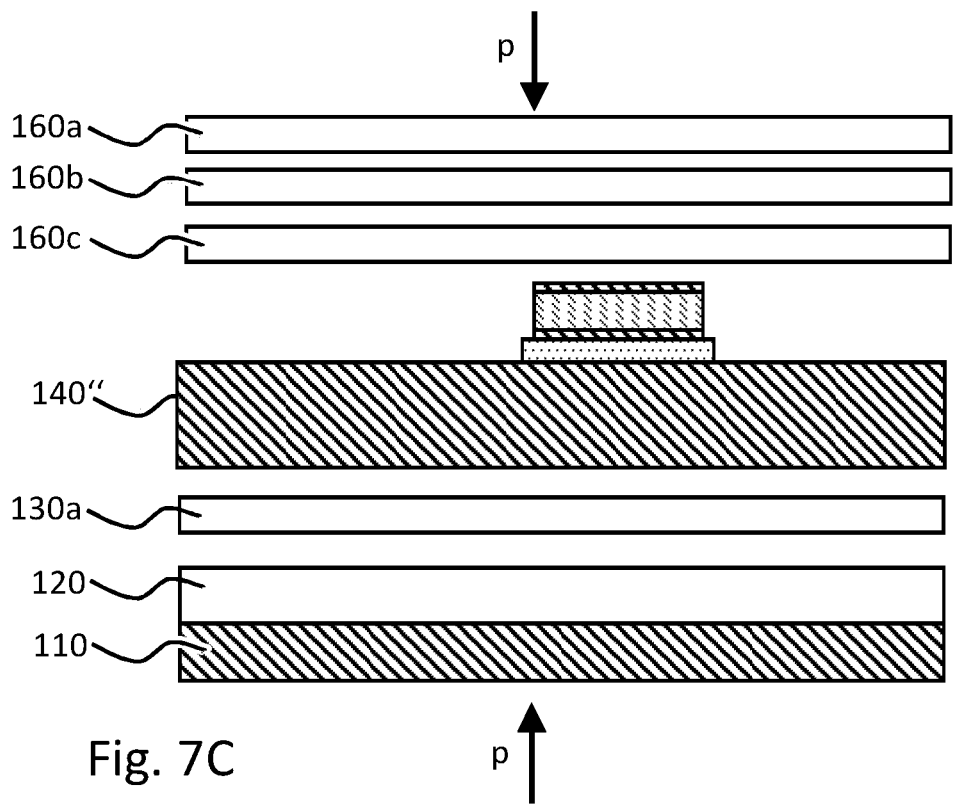

In another method step similar as in the exemplary embodiment described above with reference to FIGS. 2A to 2D, the base plate 110, the ceramic layer 120, at least one first prepreg layer 130a, the lead frame 140" together with the power semiconductor device 150 attached to the lead frame 140", and at least one second prepreg layer 160a, 160b, 160c are arranged in a layer stack (also referred to as a layer-up process) as shown in FIG. 7C. This layer stack is then fused together by applying pressure and heat (also referred to as a prepreg bonding process). The prepreg layers 130a, 160a, 160b, 160c have the characteristics of an adhesive which may be activated by temperature and/or pressure applied to the layer stack. After the prepreg bonding process, the at least one first prepreg layer 130a is transformed into the first insulating layer 130 and the at least one second prepreg layer 160a, 160b, 160c is transformed into the second insulating layer 160". Compared to FIG. 2C and FIG. 5C there are shown more second prepreg layers 160a, 160b and 160c which indicates that more prepreg material may be necessary in the exemplary embodiment of a method for manufacturing the power module device 500 for embedding the power semiconductor device 150 between the lead frame 140" and the second insulating layer 160".

Thereafter, first to third holes are drilled through the second insulating layer 160" similar as described above with reference to FIG. 2D. The only difference here is that holes through a portion the second insulating layer 160" located above the power semiconductor device 150 are shorter than holes drilled through a portion of the second insulating layer 160" not located above the power semiconductor device 150. A first via 2" is formed in each first hole, a second via 4" is formed in each second hole, and a third via 6" is formed in each third hole similar as described above.

Then, the electrically conductive layer 180 is formed on the resulting structure to obtain the power module device shown in FIG. 6A.

Figure 6B:
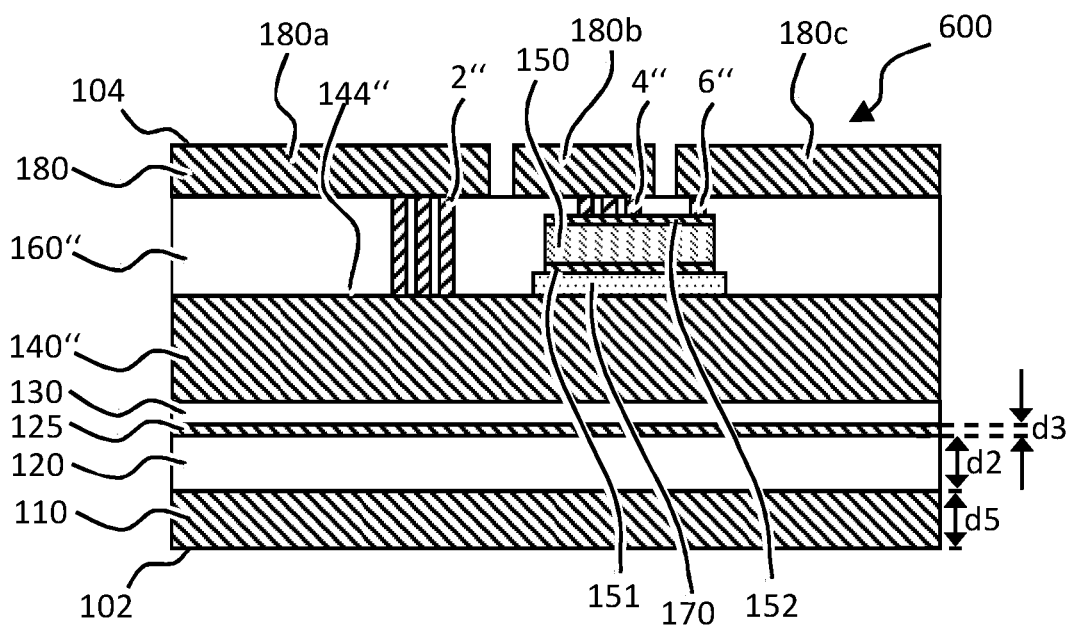
FIG. 6B shows a cross-section of a power module device according to a modification of the third embodiment.

In FIG. 6B a cross-section of a power module device 600 according to a modification of the third embodiment is shown. Due to many similarities between the power module device 500 and the power device 600, only differences will be explained in the following, whereas with regard to all other features it is referred to the above discussion of power module device 500. The power module device 600 differs from the power module device 500 only in that an adhesion layer 125 is arranged between the ceramic layer 120 and the first insulating layer 130 as in the modified first or second embodiment, wherein the adhesion layer 125 comprises a metal layer such as a copper layer. A layer thickness d3 of the adhesion layer 125 may be less than 50 μm or less than 25 μm or less than 10 μm. Exemplarily the layer thickness d5 of the base plate 110 is at least two or three times the layer thickness d3 of the adhesion layer 125. The adhesion layer 125 may be in direct contact to the ceramic layer 120 and to the first insulating layer 130, respectively. By means of the adhesion layer 125 a connection between the ceramic layer 120 and the first insulating layer 130 can be facilitated as in the modified first or second embodiment. The connection is stronger and more stable and thereby more reliable than without the adhesion layer 125.

An exemplary method for manufacturing power module device 600 is similar to the exemplary method for manufacturing power module device 500 described above. The only difference is that the copper adhesive layer 125 described above is formed on the ceramic layer 120 by e.g. a sputtering process, additive manufacturing or cold spraying before the prepreg bonding process. In the layer stack formed by the layer-up process, the copper adhesive layer 125 is arranged between the ceramic layer 120 and the at least one first prepreg layer 130a to enhance connection between the ceramic layer 120 and the at least one first prepreg layer 130a.

It will be appreciated by those skilled in the art that the present invention can be embodied in other specific forms without departing from the scope of the invention as defined by the appended claims.

All above embodiments were described with the electrically conductive layer 180 including three separate layer portions 180a, 180b, 180c for contacting two main terminals and one control terminal of the power semiconductor device 150. However, the power semiconductor device 150 in the power module device 100-600 of the invention may comprise no control terminal and accordingly, the electrically conductive layer 180 may comprise only two separate layer portions 180a and 180b. Also, the main terminals and/or control terminals may not be connected to the electrically conductive layer 180 but to other external contact terminals than the electrically conductive layer 180, and the electrically conductive layer 180 of the power module device 100-600 may comprise any other number of separate layer portions 180a, 180b, 180c or the power module device 100-600 may comprise 110 electrically conductive layer 180 at all.

The power module device according to any embodiment of the invention may comprise plural power semiconductor devices. Each of these plural power semiconductor devices may be arranged in a separate recess in the lead frame. Also, these plural power semiconductor devices may be electrically connected to each other through the electrically conductive layer 180, through one or more vias extending through the second insulating layer 160, 160', 160" and/or through other conductive elements in the power module device such as the lead frame 140, 140', 140".

In all exemplary embodiments for manufacturing one of the power module devices 100-600 the electrically conductive layer 180, 180', 180" was formed after the prepreg bonding process. However, at least a portion or all of the electrically conductive layer 180, 180', 180" may be included already in the layer stack before the prepreg bonding process. In this case, for forming the first to third vias extending through the second insulating layer 160, 160', 160", first to third holes 2a, 4a, 6a would have to be drilled not only through the second insulating layer 160, 160', 160", but through a layer stack comprising the electrically conductive layer 180, 180', 180" and the second insulating layer 160, 160', 160".

In the exemplary embodiments for forming one of the power module devices 100-600 the second prepreg layers 160a, 160b, 160c where shown in the figures as continuous layers having a constant thickness. However, the at least one second prepreg layers 160a, 160b, 160c may be precut such as to form a cavity opening to the bottom side of the at least one second prepreg layer 160a, 160b, 160c. This Cavity may correspond to the shape of semiconductor device 150 such that at least a portion of the semiconductor device 150 is accommodated in such cavity once the at least one second prepreg layer 160a, 160b, 160c is laid on top of the lead frame 140', 140" with the power semiconductor device 150 attached to it. Precutting of the at least one second prepreg layer 160a, 160b, 160c such as to form the cavity allows a close contact of the at least one second prepreg layer 160a, 160b, 160c to the power semiconductor device 150 already before the prepreg bonding process is started by applying heat and/or pressure, and therefore helps to closely embed the power semiconductor device 150.

In the above exemplary embodiments the power module device 100 to 600 are mono layer PCB devices with only one single electrically conductive layer 180, 180', 180" on the second insulating layer 160, 160', 160". However, in modified exemplary embodiments, the power module device is a multilayer PCB device which comprise a stack of plural electrically conductive layers vertically separated by additional insulating layers on top of the second insulating layer 160, 160', 160". In such multilayer PCB the plural electrically conductive layers may be interconnected by additional vias extending through the additional insulating layers. Each of the electrically conductive layers may comprise one single area or consist of plural sub-areas which are electrically insulated. In this manner a more complex electric circuit could be implemented.

It should be noted the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

The invention claimed is:

1. A power module device comprising:
a base plate;
an electrically insulating ceramic layer arranged on the base plate;
an electrically insulating first insulating layer arranged on the ceramic layer opposite from the base plate, wherein the first insulating layer comprises a prepreg material and wherein a layer thickness of the first insulating layer is less than 100 µm;
an electrically conductive lead frame arranged on the first insulating layer, the lead frame being electrically insulated from the base plate by the ceramic layer and the first insulating layer;
a power semiconductor device disposed on the lead frame; and
an electrically insulating second insulating layer arranged on the power semiconductor device and the lead frame so that the power semiconductor device is embedded between the lead frame and the second insulating layer.

2. The power module device according to claim 1, wherein the first insulating layer is in direct contact with the lead frame.

3. The power module device according to claim 1, wherein the base plate comprises an electrically conductive material.

4. The power module device according to claim 1, wherein the second insulating layer comprises a prepreg material.

5. The power module device according to claim 1, wherein the layer thickness of the first insulating layer is less than 70 µm.

6. The power module device according to claim 1, wherein the ceramic layer has a thermal conductivity above 20 W/(m×K).

7. The power module device according to claim 1, wherein a recess is formed in the lead frame on a side opposite to the first insulating layer and wherein at least a portion of the power semiconductor device is arranged in the recess.

8. The power module device according to claim 1, wherein a layer thickness of the ceramic layer is 200 µm or less.

9. The power module device according to claim 1, wherein a layer thickness of the ceramic layer is in a range from 50 µm and 100 µm.

10. The power module device according to claim 1, wherein the power semiconductor device comprises a semiconductor chip having a metallization layer disposed on a bottom side, the metallization layer being electrically connected to the lead frame.

11. The power module device according to claim 1, wherein the power semiconductor device comprises at least one of an insulated gate bipolar transistor, a thyristor, a metal-insulator-semiconductor field effect transistor, a metal-oxide-semiconductor field effect transistor, a junction field effect transistor, a diode, or a Schottky diode.

12. The power module device according to claim 1, further comprising an adhesion layer between the ceramic layer and the first insulating layer, wherein the adhesion layer comprises a metal layer.

13. The power module device according to claim 12, wherein a layer thickness of the adhesion layer is less than 25 µm.

14. The power module device according to claim 12, wherein the first insulating layer is in direct contact with the adhesion layer.

15. The power module device according to claim 1, wherein the first insulating layer is in direct contact with the ceramic layer.

16. A method for manufacturing the power module device of claim 1, the method comprising:
attaching the power semiconductor device to the lead frame;
forming the electrically insulating ceramic layer on the base plate;
forming a layer stack by arranging the first insulating layer over the base plate with the ceramic layer formed thereon, arranging the lead frame with the power semiconductor device attached thereto over the first insulating layer, and arranging a second insulating layer over the lead frame; and
applying heat and pressure to the layer stack.

17. The method according to claim 16, wherein attaching the power semiconductor device to the lead frame comprises electrically connecting a metallization layer of a semiconductor chip of the power semiconductor device to the lead frame.

18. The method according to claim 16, wherein the ceramic layer is adhered to the first insulating layer with a metal adhesion layer.

19. A power module device comprising:
a copper base plate;
an electrically insulating ceramic layer arranged on the base plate, wherein a layer thickness of the ceramic layer is 70 µm or less;
an electrically insulating first insulating layer arranged on the ceramic layer, wherein the first insulating layer comprises a prepreg material and wherein a layer thickness of the first insulating layer is less than 100 µm;
an electrically conductive lead frame arranged on the first insulating layer, the lead frame being electrically insulated from the base plate by the ceramic layer and the first insulating layer;
a power semiconductor device disposed on the lead frame; and
an electrically insulating second insulating layer arranged on the power semiconductor device, wherein the second insulating layer comprises a prepreg material.

20. The power module device according to claim 19, wherein the ceramic layer has a thermal conductivity above 20 W/(m×K).

* * * * *